US008530589B2

(12) United States Patent
Scher et al.

(10) Patent No.: US 8,530,589 B2
(45) Date of Patent: *Sep. 10, 2013

(54) PRINT PROCESSING FOR PATTERNED CONDUCTOR, SEMICONDUCTOR AND DIELECTRIC MATERIALS

(75) Inventors: Erik Scher, San Francisco, CA (US); Steven Molesa, Sunnyvale, CA (US); Joerg Rockenberger, San Jose, CA (US); Arvind Kamath, Mountain View, CA (US); Ikuo Mori, San Jose, CA (US)

(73) Assignee: Kovio, Inc., San Jose, CA (US)

( * ) Notice: Subject to any disclaimer, the term of this patent is extended or adjusted under 35 U.S.C. 154(b) by 731 days.

This patent is subject to a terminal disclaimer.

(21) Appl. No.: 12/114,741

(22) Filed: May 2, 2008

(65) Prior Publication Data

US 2009/0065776 A1    Mar. 12, 2009

Related U.S. Application Data

(60) Provisional application No. 60/927,984, filed on May 4, 2007, provisional application No. 60/997,335, filed on Oct. 1, 2007.

(51) Int. Cl.
*H01L 29/16* (2006.01)
*C08J 3/28* (2006.01)
*C08F 2/42* (2006.01)

(52) U.S. Cl.
USPC ............ 525/474; 525/50; 438/478; 438/482; 438/487

(58) Field of Classification Search
USPC ............ 522/81, 77, 148, 172, 163; 438/197, 438/299, 301, 478, 500, 501, 502, 282, 287; 525/50, 474; 257/52, 616, 613, 63, E29.068, 257/E29.003, E21.115
See application file for complete search history.

(56) References Cited

U.S. PATENT DOCUMENTS

| 5,652,019 | A | 7/1997 | Moran |
| 5,874,197 | A | 2/1999 | Felten |
| 6,200,508 | B1 | 3/2001 | Jacobson et al. |
| 6,294,401 | B1 | 9/2001 | Jacobson et al. |
| 6,503,570 | B2 | 1/2003 | Matsuki et al. |
| 6,503,831 | B2 | 1/2003 | Speakman |
| 6,855,378 | B1 | 2/2005 | Narang |
| 6,951,666 | B2 | 10/2005 | Kodas et al. |
| 7,115,507 | B2 | 10/2006 | Kawase |
| 7,223,802 | B2 * | 5/2007 | Aoki et al. ............... 522/148 |
| 2003/0045632 | A1 | 3/2003 | Shiho et al. |
| 2003/0124259 | A1 | 7/2003 | Kodas et al. |
| 2003/0180451 | A1 | 9/2003 | Kodas et al. |
| 2004/0070705 | A1 | 4/2004 | Kobayashi |
| 2004/0248429 | A1 | 12/2004 | Aoki |
| 2005/0008880 | A1 | 1/2005 | Kunze et al. |
| 2005/0089679 | A1 | 4/2005 | Ittel et al. |
| 2005/0176183 | A1 | 8/2005 | Aoki |
| 2005/0214688 | A1 | 9/2005 | Yamamoto et al. |
| 2006/0001726 | A1 | 1/2006 | Kodas et al. |
| 2006/0159838 | A1 | 7/2006 | Kowalski et al. |
| 2006/0160277 | A1 | 7/2006 | Sirringhaus et al. |
| 2007/0078252 | A1 | 4/2007 | Dioumaev |
| 2007/0096057 | A1 | 5/2007 | Hampden-Smith et al. |

FOREIGN PATENT DOCUMENTS

| EP | 1087428 A1 | 3/2001 |
| JP | 9-237927 | 9/1997 |
| JP | 2003313299 A * | 11/2003 |
| JP | 2005-219981 | 8/2005 |
| JP | 2005219981 A * | 8/2005 |

OTHER PUBLICATIONS

Tatsuya Shimoda, Yasuo Matsuki, Masahiro Furusawa, Takashi Aoki, !chi° Yudasaka, Hideki Tanaka, Haruo Iwasawa, Daohai Wang, Masami Miyasaka and Yasumasa Takeuchi; "Solution-Processed Silicon Films and Transistors"; Letters, vol. 440 / Apr. 6, 2006 / doi:10.1038 / nature04613; pp. 783-786; 2006 Nature Publishing Group.

International Preliminary Report on Patentability; International Application No. PCT/US2008/062586; Dated Nov. 17, 2009; 6 pages; International Bureau of WIPO, Geneva, Switzerland.

Tatsuro Beppu, Shuji Hayase, Toshiro Hiraoka, Atsushi Kamata, and Kenji Sano; "Semiconductor Film Forming Method and Solar Cell Manufacturing Method"; Patent Abstracts of Japan; English Abstract of Japanese Patent Application Publication No. 09-237927; Publication Date: Sep. 9, 1997; 2 pgs.; Japan Patent Office, Japan.

Takashi Aoki; "Method of Preparing Higher Order Silane Solution, Method of Forming Silicon Film, Silicon Film, Thin Film Transistor (TFT), and Electro-Optic Device"; Patent Abstracts of Japan; English Abstract of Japanese Patent Application Publication No. 2005-219981; Publication Date: Aug. 18, 2005; 1 pg.; Japan Patent Office, Japan.

Chinese Office Action dated Dec. 7, 2010; Chinese Patent Application No. 200880014741.8; The State Intellectual Property Office of People's Republic of China, People'Republic of China.

* cited by examiner

*Primary Examiner* — Sanza McClendon
(74) *Attorney, Agent, or Firm* — Murabito, Hao & Barnes LLP; Andrew D. Fortney (57) ABSTRACT

Embodiments relate to printing features from an ink containing a material precursor. In some embodiments, the material includes an electrically active material, such as a semiconductor, a metal, or a combination thereof. In another embodiment, the material includes a dielectric. The embodiments provide improved printing process conditions that allow for more precise control of the shape, profile and dimensions of a printed line or other feature. The composition(s) and/or method(s) improve control of pinning by increasing the viscosity and mass loading of components in the ink. An exemplary method thus includes printing an ink comprising a material precursor and a solvent in a pattern on the substrate; precipitating the precursor in the pattern to form a pinning line; substantially evaporating the solvent to form a feature of the material precursor defined by the pinning line; and converting the material precursor to the patterned material.

39 Claims, 4 Drawing Sheets

PRINT PROCESSING FOR PATTERNED CONDUCTOR, SEMICONDUCTOR AND DIELECTRIC MATERIALS

RELATED APPLICATIONS

This application claims the benefit of U.S. Provisional Patent Application Nos. 60/927,984 and 60/997,335, respectively filed May 4, 2007 and Oct. 1, 2007, incorporated herein by reference in its entirety.

FIELD OF THE INVENTION

Embodiments of the present invention relate to printing (e.g., inkjet printing) a composition containing precursors to silicon, germanium, metal and/or dielectrics to form semiconductor, conductor and/or dielectric features. The embodiments provide improved printing process conditions that allow for more precise control of a critical dimension of a dielectric, conductor or semiconductor feature. In one embodiment, to print a semiconductor film in a predetermined shape (e.g., an anisotropic shape, such as a line or an island), the printed silicon-containing ink may be fixed or "pinned." This and other embodiments described below provide processes that may improve control of feature pinning and the resulting film profile. As a result, critical dimensions of a semiconductor, metal or dielectric feature may be more precisely controlled.

DISCUSSION OF THE BACKGROUND

Previously, there have been challenges in precisely controlling certain critical dimensions in printed electrically functional features (and especially high resolution dielectric, conductor and semiconductor features). Conventional printing process conditions have resulted in poor control of length, height (thickness), cross-sectional profile and width of printed lines and islands. Thus, an ideal profile for printed features in a high performance device such as a thin film transistor (TFT) has been difficult to achieve.

Conventional printing processes may rely on an absorbing substrate (e.g., paper or cloth) to fix a position and a size of a deposited material (e.g., an ink). However, substrates typically used in manufacturing electronic devices are generally non-absorbing. The ink, as printed on a non-absorbing substrate, will behave as a liquid and will tend to move and/or spread until (or unless) the solvent is evaporated. Typically, the evaporation rate of the deposited ink is greatest near its edge, and liquid from the bulk of the drop tends to flow to the edge as evaporation occurs, resulting in deposition of solute particles near the edge. This phenomenon is sometimes referred to as "coffee ring" formation. The coffee ring profile is undesirable for semiconductor, conductor and/or dielectric structures in microelectronic applications, and there is a need for printing processes that form semiconductor, conductor and dielectric features having a more uniformly distributed shape (e.g. a dome-shaped profile), which is critical to obtaining high performance devices.

Organic electronic printing has been done on solid substrates using surface energy patterning and/or printing into predefined structures (formed by photolithography or another radiation-based patterning process) such as wells. In an all-additive, all-printed process, these methods preferably are not used. In order to fix the anisotropic shape (typically a line) of the active (e.g., Si) components, the line must be fixed or "pinned." Without a mechanism for pinning the liquid as the solvent evaporates, the liquid will generally retreat until it forms one or more spherical drops on the surface, rather than a line or pattern.

SUMMARY OF THE INVENTION

The present invention concerns compositions and processes for printing relatively high performance semiconductor (e.g., silicon), conductor (e.g., metal), and dielectric (e.g., oxide) features. More specifically, the embodiments of the present invention relate to improved printing processes (e.g., inkjet printing) for forming silicon, metal and/or dielectric features, compositions useful in such printing processes, and structures formed therefrom. Controlling the solubility of the dielectric, silicon and/or metal precursor in the ink during a post-printing dynamic drying process allows for beneficial control of the profile of the resulting feature. Thus, the processes described herein allow for more precise control of critical and non-critical dimensions of dielectric, semiconductor and conductor features (e.g., lines, rectangles, T shapes, L shapes, H shapes, dumbbell shapes, tabs, circles, squares, combinations thereof, etc.) in printed electronic circuits and devices.

In order to print a semiconductor, metal or dielectric film in a predetermined shape (e.g., a line, island, rectangle, T shape, L shape, H shape, dumbbell shape, tab, circle, square, combination thereof, or other pattern), the printed ink may be fixed or "pinned." A deposited liquid ink on a substrate may be pinned by forming one or more pinning points (e.g., a pinning line) to define the outline of a printed feature (i.e., the liquid becomes fixed at the pinning point(s)). To effectively pin a feature from a printed silicon, metal or dielectric ink on a semiconductor or other substrate used for manufacturing electronic devices, a solute in the printed ink (in the case of silicon, for example, a silicon containing component of essentially any form) should precipitate out of the ink solvent. Pinning by solute precipitation may be controlled by varying the mass loading, the ink viscosity, and the evaporation characteristics of a printed semiconductor-, dielectric- or metal-containing liquid. Further, pinning of the printed liquid in a desired shape may be optimized by increasing the mass loading of a film precursor solute in the liquid and/or irradiating the printed ink (e.g., with UV, visible, infrared and/or actinic radiation), either simultaneously with or immediately subsequent to printing (e.g., within 0.1 sec to 10 sec). Irradiating the printed liquid with a certain dose and wavelength of radiation may result in cross-linking, isomerization, oligomerization, polymerization and/or ligand removal of all or part of the printed silicon, metal or dielectric ink, and may therefore form a precipitate that, in turn, forms a pinning point or edge. Balancing mass loading, viscosity, evaporation characteristics and/or irradiation may result in improved pinning and the formation of well-defined printed semiconductor, metal or dielectric features. Preferably, the feature has an anisotropic shape and/or a dome-shaped cross-sectional profile. The irradiation dose and wavelength(s) (particularly for UV irradiation) may have particular importance in controlling the pinning process for a printed silicon-containing ink.

Ink viscosity can also substantially affect the pinning and profile of the structure or film formed from the printed ink. A solute that increases the viscosity of the ink as the ink dries may increase the probability and/or reproducibility of obtaining a dome-shaped profile, as opposed to a "coffee-ring" type profile. In many applications, a dome-shaped profile (particularly in a cross section taken along a relatively short axis in a layout view) may be an ideal profile for use in printed dielectric, semiconductor and conductor applications. In many inks, viscosity may be increased by higher molecular weight (MW) solutes in the ink, for instance a polysilane or other Group IVA compound (e.g., a compound comprising Si and/or Ge) having at least 15 Si and/or Ge atoms, nanoparticles of silicon, germanium, metal, metal oxide and/or nitride, etc. An increased viscosity tends to offset (or reduce the rate of) mass transport to the edge of the pinning site, and may result in a dome-shaped profile that can be maintained during evaporation of the solvent.

Embodiments of the present invention provide improved printing process conditions that allow for more precise control of a cross-sectional profile and/or dimensions of a dielectric, semiconductor or conductor feature, such as a line, rectangle, T shape, L shape, H shape, dumbbell shape, tab, circle, square, combination thereof, etc. The method of printing a feature on a substrate (e.g., printing a liquid semiconductor-containing composition to form a line or other shape) with improved pinning and more precisely controlled dimensions may include the steps of: (a) printing an ink comprising a precursor of a material in a pattern on a substrate, (b) precipitating the precursor (or a higher molecular weight or more insoluble derivative thereof) in the pattern to form a pinning line, (c) substantially evaporating the solvent to form the feature defined by the pinning line and comprising the precursor (or a higher molecular weight or more insoluble derivative thereof), and (d) converting the precursor (or a higher molecular weight or more insoluble derivative thereof) to the patterned material. The method may further comprise controlling a contact angle of the ink by depositing a surface energy modifying agent on said substrate before printing the precursor ink, and converting the precursor (or a higher molecular weight or more insoluble derivative thereof) may comprise curing the precursor (or derivative thereof and/or material).

A further aspect of the invention concerns an ink composition generally comprising (i) from 1 to 40% of a semiconductor precursor selected from the group consisting of (poly)silane and nanoparticles of silicon and/or germanium by weight, the (poly)silane consisting essentially of species having at least 5 silicon and/or germanium atoms and hydrogen, and (ii) a solvent in which the (poly)silane is soluble, wherein the composition has a viscosity of from 2 to 100 cP. In some embodiments, the (poly)silane may comprise 15 or more silicon and/or germanium atoms, and/or the composition may have a viscosity of from 2 to 15 cP. The solvent may include a hydrocarbon solvent (e.g., an alkane such as hexane[s], octane, or decane, or a cycloalkane such as cyclohexane, cyclooctane, or cis-decalin).

The invention further relates to a pattern in a device (e.g., a capacitor, a diode, a resistor, or a TFT) comprising a semiconductor material including a Group IVA element(s), and having a dome-shaped profile. The semiconductor material may comprise hydrogenated amorphous, microcrystalline or polycrystalline silicon. The semiconductor material may also comprise germanium or a mixture of silicon and germanium. The present invention may be used for the printing of both semiconductor channels (islands) and silicon gates in a semiconductor device, using an ink comprising a doped or undoped (poly)silane, silicon and/or germanium nanoparticles, or a combination thereof. In the present invention, the dimensions of all or substantially all of the patterned features in the device may be defined directly by parameters and/or conditions of the present printing process.

The principles described herein should also be applicable to inks containing other precursors of electronically functional materials, such as metal inks comprising organometallic compounds and/or metal nanoparticles, and to inks containing precursors of electrically insulative materials, such as inks comprising compounds that serve as precursors to inorganic dielectrics (e.g., silicates, silicones, sesquioxanes, tetraalkoxysilanes, trialkoxyaluminum compounds, titanium tetraalkoxides, and/or nanoparticles of silica, alumina, ceria, titania, zirconia, etc.). Embodiments of the present invention relate to improved printing processes (e.g., inkjet printing) for forming various features in electronic devices. The described processes allow for relatively precise control of feature dimensions, and in preferred embodiments, provide the features with a dome-shaped cross-sectional profile along at least one dimension. This approach to forming printed structures may be cost effective due to (i) the efficient usage of the precursor materials and (ii) the combination of deposition and patterning into one printing step. The present invention may be applicable to the manufacturing of thin film transistors, capacitors, diodes, resistors, etc., and circuits containing the same on various substrates including, but not limited to, glass (e.g., quartz) sheets or slips, plastic and/or metal foils, sheets or slabs, silicon wafers, etc., all of which may further include one or more buffer layers (such as a polyimide or other polymer, silicon and/or aluminum oxide, etc.) thereon. Applications of the circuitry include but are not limited to displays, RF devices, sensors, volatile and nonvolatile memory, photovoltaic cells, etc. Further benefits and other advantages of the present invention will become readily apparent from the detailed description of the preferred embodiments.

DETAILED DESCRIPTION OF THE PREFERRED EMBODIMENTS

Reference will now be made in detail to preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following disclosure, numerous specific details are given to provide a thorough understanding of the invention. However, it will be apparent to one skilled in the art that the present invention may be practiced without these specific details. In other instances, well-known methods, procedures, components, and circuits have not been described in detail, to avoid unnecessarily obscuring aspects of the present invention.

In the present disclosure, the term "deposit" (and grammatical variations thereof) is intended to encompass all forms of deposition, including blanket deposition, coating, and printing, unless the context clearly indicates otherwise. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. The term "silane" refers to compounds or mixtures of compounds that contain primarily or consist essentially of (1) silicon and/or germanium and (2) hydrogen, and the term "polysilane" refers to compounds or mixtures of compounds that predominantly contain species having at least 15 silicon and/or germanium atoms. The term "(poly)silane" refers to compounds or groups of compounds that are silanes, polysilanes or both. Such (poly)silane species (i.e., silane and/or polysilane) may contain one or more cyclic rings and an amount or atomic percentage of halogen atoms (such as Cl) that does not have a significant adverse effect on the properties of a given composition for a particular application. The term "(cyclo)alkane" refers to compounds or mixtures of compounds that consist essentially of carbon and hydrogen, and that may be linear, branched, or cyclic. The term "(cyclo)silane" refers to compounds or mixtures of compounds that consist essentially of (1) silicon and/or germanium and (2) hydrogen, and that may contain one or more cyclic rings and less than 15 silicon and/or germanium atoms. The term "hetero(cyclo)silane" refers to compounds or mixtures of compounds that consist essentially of (1) silicon and/or germanium, (2) hydrogen, and (3) one or more dopant atoms such as B, P, As or Sb that may be substituted by a conventional hydrocarbon, silyl or germyl substituent and that may contain one or more cyclic rings. In the context of the present application, the term "(poly)silane" includes hetero (cyclo)silanes. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes, generally the length and width).

The present invention concerns a composition generally comprising (i) a (poly)silane, (poly)germane, (poly)silagermane, and/or silicon and/or germanium nanoparticles in an amount of from 1 to 40% by weight, the (poly)silane, (poly)germane and (poly)silagermane consisting essentially of species having at least 5 silicon and/or germanium atoms and hydrogen, and (ii) a solvent in which the (poly)silane, (poly)germane, (poly)silagermane, and/or silicon and/or germanium nanoparticles are soluble, the composition having a viscosity of from 2 to 100 (e.g., 2 to 15) cP. In some embodiments, the (poly)silane, (poly)germane and (poly)silagermane species may comprise 15 or more silicon and/or germanium atoms. The composition may comprise or further include a cyclic Group IVA compound of the formula $(AH_z)_n$. Typically, in the formula $(AH_z)_n$, is from 3 to 20, A is independently Si or Ge, and each of the n instances of z is independently 1 or 2. The solvent may include a hydrocarbon solvent (e.g., an alkane such as hexane, octane, or decane, or a cycloalkane such as cyclohexane, cyclooctane, or cis-decalin).

The present invention may further concern a method of making the composition, which comprises combining the (poly)silane, (poly)germane, (poly)silagermane, and/or silicon and/or germanium nanoparticles (and optionally, the cyclic Group IVA compound) with the solvent, and mixing the (poly)silane, (poly)germane, (poly)silagermane, and/or silicon and/or germanium nanoparticles (and optional cyclic Group IVA compound) and the solvent sufficiently to dissolve the (poly)silane, (poly)germane, (poly)silagermane, and/or silicon and/or germanium nanoparticles (and optional cyclic Group IVA compound) in the solvent. Compositions including a (cyclo)alkane solvent may exhibit unusually good stability relative to otherwise identical compositions including an arene or other solvent.

Embodiments of the present invention further relate to methods of printing (e.g., inkjet printing, gravure printing, offset lithography, screen printing, flexography or flexographic printing, microspotting, pen-coating, syringe dispensing, pump dispensing, spray-coating, slit coating, extrusion coating, etc.) an ink composition to form features in an electronic circuit (e.g., patterns of semiconductor, conductor, and/or dielectric materials). Such embodiments provide improved printing conditions that allow for more precise control of the dimensions of a semiconductor, conductor or dielectric feature. The method of printing a feature on a substrate (e.g., printing a liquid composition comprising a precursor material to form a feature such as a line or other shape) may include the steps of: (a) printing an ink comprising a precursor of a material in a pattern on a substrate, the ink having a viscosity of from 2 to 100 cP, (b) precipitating the precursor (or a higher molecular weight or more insoluble derivative thereof) in the pattern to form a pinning line, (c) substantially evaporating the solvent to form the feature defined by the pinning line and/or pattern and comprising the precursor (or a higher molecular weight or more insoluble derivative thereof), and (d) converting the precursor (or a higher molecular weight or more insoluble derivative thereof) to the patterned material.

Even further aspects of the invention concern a patterned semiconductor material in a device (e.g., a capacitor, a diode, a resistor or a TFT), the semiconductor material including a Group IVA element(s) (i.e., Si and/or Ge) and having a dome-shaped cross-sectional profile. In various embodiments, the semiconductor material may comprise hydrogenated amorphous, microcrystalline or polycrystalline silicon. The semiconductor material may also comprise germanium or a mixture of silicon and germanium. In various embodiments, the Group IVA semiconductor material may comprise less than about 0.1 at. % oxygen, less than about 100 ppm nitrogen, and/or less than about 0.1 at. % carbon. The line (or feature) width of the pattern may be from about 1 to about 100 μm (e.g., 1 to 20 μm, 2 to 10 μm, or any other range of values therein). The height (e.g., the maximum height) of the pattern may be from about 5 nm to about 10 μm (e.g., 25 nm to about 1 μm, or any other range of values therein).

Exemplary Inks and Methods of Making the Same

Embodiments of the present invention relate to an ink composition generally comprising (i) a Group IVA element precursor (e.g., a (poly)silane, (poly)germane, (poly)silagermane, and/or silicon and/or germanium nanoparticles) in an amount of from 1 to 40% by weight of the ink composition, the Group IVA element precursor consisting essentially of species having at least 5 silicon and/or germanium atoms and hydrogen, and (ii) a solvent in which the Group IVA element precursor is soluble, wherein the composition has a viscosity of from about 2 to about 100 cP. Thus, the Group IVA element precursor (preferably Si and/or Ge, referring to the Periodic Table of the Elements) may be any straight-chain, branched, cross-linked, cyclic or polycyclic (poly)silane, (poly)germane, (poly)germasilane or (poly)silagermane (hereinafter, "(poly)silane") useful for making hydrogenated, amorphous, microcrystalline or polycrystalline semiconductor films. In some embodiments, the (poly)silane may comprise 15 or more silicon and/or germanium atoms, and/or the (poly)silane may further include one or more dopant atoms (e.g., a hetero(cyclo)silane). In certain preferred embodiments, the solvent may include a hydrocarbon solvent (e.g., a cycloalkane such as cyclohexane, cyclooctane, and cis-decalin).

Also, the Group IVA element precursor may include silicon and/or germanium nanoparticles, which may be passivated with one or more passivation groups. The passivation layer may be chemically bound to the semiconductor nanoparticles by covalent bonds (e.g., a direct silicon-hydrogen, silicon-oxygen or silicon-carbon bond), by coordination bonds, by hydrogen-bonding, by Van der Waals forces and/or by ionic bonds. Preferably, the passivation layer comprises one or more of the following: (i) an alcohol and/or alcoholate; (ii) a thiol and/or thiolate; (iii) an alkyl, aryl and/or aralkyl group; (iv) hydrogen; (v) a halogen, such as F, Cl, Br, and/or I; (vi) a silyl and/or germyl group, generally containing from 1 to 4 Si and/or Ge atoms and one or more alkyl (e.g., methyl, ethyl, t-butyl) or aryl (e.g., phenyl) groups thereon; and/or (vii) a surfactant, such as an amine, an amine oxide, a quaternary ammonium salt, a betaine, a sulfobetaine, an ether, a polyglycol, a polyether, a polymer, an organic ester, a phosphine, a phosphate, a sulfonic acid, a sulfonate, a sulfate, a ketone, and/or a silicone (see, e.g., U.S. patent application Ser. No. 10/616,147, filed on Jul. 8, 2003, the relevant portions of which are incorporated herein by reference).

In various embodiments, the (poly)silane has an atomic purity of greater than 90% with respect to silicon, germanium and hydrogen (i.e., greater than 90% of the atoms in the polysilane are Si, Ge or H). In one example, the (poly)silane has an atomic purity of greater than 90% with respect to silicon and hydrogen. Thus, the (poly)silane can contain up to 10 at. % of other species (such as boron, gallium, phosphorous, arsenic, antimony, halogens [e.g., F, Cl, Br, etc.], carbon, oxygen, nitrogen, etc.) as long as the other species do not significantly adversely affect the electrical properties of a film formed from the (poly)silane for a given application. In certain embodiments, the (poly)silane may further include one or more dopant atoms (e.g., B, Ga, P, As, or Sb) in an amount up to about 10 at. % (or any maximum value less than 10 at. %) with respect to silicon, germanium, hydrogen, and the dopant element. Preferably, however, the (poly)silanes have an atomic purity of at least 95%, at least 99%, or any minimum value above 90 at. %, with respect to silicon, germanium and hydrogen. In a particularly preferred embodiment, the purity is at least 99.9% with respect to Si, Ge and H (or Si and H).

In other embodiments, the (poly)silane compound may have the formula $A_nH_{2n+2}$ (e.g., $Si_nH_{2n+2}$), $A_nH_{2n-p}$ (e.g., $Si_nH_{2n-p}$) and/or cyclo-$A_mH_{2m}$ (e.g., $Si_mH_{2m}$), where A is Si and/or Ge, n is at least 5 (e.g., from 5 to 1,000,000, 10 to 1,000, 15 to 250, or any other range of values $\geq 5$ or $\geq 15$), p is 0 or an even integer not greater than n, and m is from 3 to about 20 (e.g., from 5 to 8, or any other range of values therein). For example, linear, cyclic, polycyclic, cross-linked or branched silanes of the general formulae $Si_kH_{2k+2}$ or —$Si_kH_{2k}$—, where k is an integer of 3, 4, or 5, up to 10, 15 or 20, or any range of values therein (particularly where n is 3 to 7), as well as germane and silagermane analogs thereof, may be made by techniques disclosed in copending U.S. patent application Ser. Nos. 10/616,147, 10/789,317, 10/949,013, and 11/867,687, filed on Jul. 8, 2003, Feb. 27, 2004, Sep. 24, 2004, and Oct. 4, 2007, the relevant portions of which are incorporated herein by reference.

In further embodiments, the (poly)silane compound may comprise (or further comprise) one or more polymers or copolymers of the above (cyclo)silanes having from 3 to 20 Si and/or Ge atoms (e.g., from 3 to 12, from 5 to 8, or any other range of values therein). For example, the (poly)silane may comprise a homopolymer of repeating -(-$A_kH_{2k}$—)— or -(c-$A_mH_{2m-2}$)— units, a block copolymer comprising one or more blocks of -(-$A_kH_{2k}$—)— and/or -(c-$A_mH_{2m-2}$)— units (each block of which may include one or more such units in a given block), or a random copolymer of such units, any of which may be branched, cross-linked, or (poly)cyclic (e.g., condensed, or cross-linked to itself), and where k and m are as described herein. Methods of forming (poly)silanes as described in this paragraph are disclosed in copending U.S. patent application Ser. No. 11/867,587, filed on Oct. 4, 2007, and entitled, "Silicon Polymers, Methods of Polymerizing Silicon Compounds, and Methods of Forming Thin Films from Such Silicon Polymers." In addition, the (co)polymer may be linear, branched, cross-linked, cyclic, or polycyclic.

The (poly)silane may be synthesized by a method that includes combining a (cyclo)silane compound with an elemental Group 7-12 transition metal (or a substrate-anchored or -supported derivative thereof) or a catalyst of the formula $R^3_xR^4_yR^5_zMX_w$ (or a multinuclear or substrate-anchored derivative thereof), where each instance of A is independently Si or Ge, $1 \leq a \leq 100$, and each instance of R and $R^1$ is independently hydrogen, aryl or -$A_cH_{2c+1-d}R^2_d$ (where $R^2$ is aryl, alkyl or H, and c is an integer from 1 to 4); m is an integer from 3 to 8, and r is 0 or 1 or 2; M is a metal selected from the group consisting of Rh, Fe, Ru, Os, Co, Ir, Ni, Pd, and Pt, each of x, y, z and w is an integer of from 0 to 5, and $3 \leq (w+x+y+z) \leq 6$; each instance of $R^3$, $R^4$ and $R^5$ is independently a substituted or non-substituted cyclopentadienyl, indenyl, fluorenyl, allyl, benzyl, silyl, (per)alkylsilyl, germyl, (per)alkylgermyl, hydride, phosphine, amine, sulfide, carbon monoxide, nitrile, isonitrile, siloxyl, germoxyl, hydrocarbyl, hydrocarbyloxy, hydrocarbylphosphino, hydrocarbylamino, or hydrocarbylsulfido ligand, or two or more of $R^3$, $R^4$ and $R^5$ together may be a polydentate phosphine, amine, oxo and/or carbido ligand; and X is a halogen or halogen-equivalent such as phenylsulfonyl, tolylsulfonyl, trifluoromethylsulfonyl, tetraphenylborate, tetrafluoroborate, hexafluorophos-phate, etc.; and removing the catalyst from the (poly)silane. Suitable Group 7-12 transition metals are Rh, Fe, Ru, Os, Co, Ir, Ni, Pd, and Pt.

Removing the catalyst from the (poly)silane may comprise washing the (poly)silane with a washing composition sufficiently to remove a substantial amount of metal contaminants (e.g., the catalyst). In various embodiments, the washing composition comprises or consists essentially of a polar organic solvent that is immiscible with the silane composition (e.g. acetonitrile), deionized water, a saline solution (e.g., brine), or a dilute aqueous acid. In a preferred implementation, the washing composition consists essentially of deionized water. In various alternative embodiments, the washing composition comprises dilute acid, which (i) has a pH of from 1 to less than 7 (and thus comprises a dilute aqueous acid), (ii) may further comprise a buffer (e.g., the composition comprises a buffered aqueous acid), and/or (iii) is selected from the group consisting of dilute aqueous HCl, dilute aqueous HBr, dilute aqueous HI, etc. For example, the washing composition and the (poly)silane may be present in a volume ratio of from 10:1 to 1:10 (not including any relatively non-polar organic solvent or other component that may be present in or with the (poly)silane compound), from 5:1 to 1:5, or from 3:1 to 1:1.

The (poly)silane composition preferably contains one or more relatively high molecular weight (poly)silanes having, e.g., 20, 30, 40, 50 or more silicon atoms therein. Such higher molecular weight (poly)silanes tend to increase the viscosity of the (poly)silane composition, thereby improving its properties for printing applications (e.g., inkjetting). The amount of the relatively high molecular weight (poly)silane(s) may vary, and is typically an amount providing a viscosity of from about 2 to about 100 cP (e.g., from about 2 to about 50 cP, from about 2 to about 25 cP, from about 2 to about 10 cP, from about 2 to about 5 cP, or any other range of values therein), but in many cases, it may range from about 1% to about 40% by weight of the ink (e.g., from about 1% to about 20% by weight of the ink, or any other range of values therein).

A preferred oligosilane and/or polysilane composition consists essentially of (i) hydrogen and (ii) silicon and/or germanium, and has a molecular weight of from 450 to about 2300 g/mol, which, after coating and/or printing the composition (optionally with simultaneous or immediately subsequent UV irradiation) and forming a oligo- or polysilane film, then curing, forms an amorphous, hydrogenated semiconductor film having a carbon content of not greater than 0.1 at %. In alternative embodiments, the oligosilane or polysilane may have a chain length of from 10 to 10,000, 100,000 or 1,000,000 silicon and/or germanium atoms. In further embodiments, the molecular weight (which may be a molecular weight distribution or an average molecular weight) is from about 500 to about 1500 g/mol, preferably from about 500 to about 1300 g/mol. In further embodiments, the chain length (which may be a chain length distribution or an average chain length) is from about 15 to about 1000 silicon and/or germanium units, preferably from about 15 to about 100 silicon and/or germanium units. For example, the composition may include or consist essentially of a mixture of oligosilanes and/or polysilanes, each oligosilane or polysilane therein consisting essentially of (i) hydrogen and (ii) silicon and/or germanium, and having the prescribed molecular weight and/or chain length.

In one embodiment, at least 50 mol % of the composition consists of the oligo-/polysilane. In further embodiments, at least 65 mol %, 70 mol %, 75 mol %, or 80 mol % (or any value therein or thereabove) of the composition consists of the oligo-/polysilane.

When the ink composition includes one or more Group IVA element precursors, the ink composition may further comprise one or more dopant sources, generally (but not exclusively) consisting essentially of one or more conventional semiconductor dopant atoms (e.g., B, P, As or Sb) and hydrogen, and which may have at least one substituent covalently bound thereto (e.g., a hydrocarbyl, silyl, germyl, or silagermyl group). The presence of a carbon-containing substituent on the dopant atom may not necessarily result in a significant increase in the amount of carbon in doped films formed therefrom, or in significant adverse effects on the electrical, physical and mechanical properties of such films, relative to undoped films formed from structurally analogous (poly)silane compounds. For example, the dopant source may have the formula $D_a R^1_{b'}$, where a' is 1 or 2; b' is 3a', at least a' instances of $R^1$ are $C_1$-$C_6$ alkyl, $C_6$-$C_{10}$ aryl, $C_7$-$C_{10}$ aralkyl or $AR^2_3$, where $R^2$ is hydrogen or $A_y H_{2y+1}$ ($1 \leq y \leq 4$; preferably y=1), and the remainder of the b' instances of $R^1$ are independently H, $C_1$-$C_6$ alkyl, $C_6$-$C_{10}$ aryl, $C_7$-$C_{10}$ aralkyl or $AR^2_3$. In various implementations, the dopant has the formula $D(AH_3)_3$, wherein D is P or B, and/or A is Si or Ge. The present composition may contain suitable proportions of Group IVA element precursor(s) and dopant source(s) to provide a desired doping level in the final film. For example, from 0.00001 to about 20 vol. % (or any range of values therein, such as 0.001 to 10 vol. %) of the composition may consist essentially of the dopant source. Alternatively, the dopant source(s) may be present in an amount providing from about 0.0001 to about 10 at. % (or any range of values therein) of dopant atoms with respect to Si and/or Ge atoms in the Group IVA element precursor(s).

Alternatively, the present composition may comprise one or more metal precursors such as (organo)metallic compounds, complexes, and/or clusters; one or more metal nanoparticles; and combinations thereof. For example, the (organo)metallic compounds, complexes, and clusters, as well as the metal nanoparticles, may include known compounds, complexes, clusters and/or nanoparticles of metals such as aluminum, titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, silver, gold, zinc, cadmium, gallium, indium, thallium, tin, lead, and bismuth, preferably aluminum, titanium, hafnium, tantalum, molybdenum, tungsten, cobalt, nickel, palladium, platinum, copper, silver, and gold. The ligands, passivating agents, complexing and/or coordinating species, or other species included in or combined with such metal compounds, complexes, clusters and/or nanoparticles may be any that are capable of providing an electrically active film upon further processing of the ink. However, preferably, the metal compounds, complexes, clusters and/or nanoparticles further include ligands, passivating agents, and/or complexing and/or coordinating species that consist essentially of atoms that do not adversely affect the electrical properties of such electrically active film(s), such as hydrogen, boron, silicon, phosphorous, gallium, germanium, arsenic, indium, thallium, tin, lead, antimony, bismuth, selenium and tellurium, particularly hydrogen, boron, silicon, phosphorous, germanium, arsenic, and antimony. In certain cases, particularly labile carbon-containing groups, such as a t-butyl group, may be present as a ligand on the metal precursor or as a substituent on a ligand, passivating agent, and/or complexing and/or coordinating species. A composition including such metal precursors generally has the same viscosity, mass loading and solvent requirements as the (poly)silane composition.

The solvent in the present composition may be one that provides a relatively high degree of stability to the ink composition, provides an advantageous viscosity and volatility (e.g., sufficient to prevent nozzle clogging and allow printed ink to dry at relatively low temperatures and relatively short times [e.g., as described herein]) and/or that is generally easily and/or thoroughly removable from the composition. For example, the solvent preferably is one that is substantially completely removed by printing the ink onto a platen at a temperature of 30-90° C., followed by heating for 10 min at 100° C. Thus, the solvent preferably comprises one or more hydrocarbon solvents, such as an alkane, a monocycloalkane, a bicycloalkane, a substituted monocycloalkane, a substituted bicycloalkane, a (cyclic) siloxane and/or a fluoroalkane. The solvents are generally those that are liquid at ambient temperatures (e.g., 15-30° C.). Thus, the solvent may be selected from the group consisting of $C_5$-$C_{12}$ linear and/or branched alkanes; $C_6$-$C_{12}$ monocycloalkanes; $C_3$-$C_8$ monocycloalkanes substituted with from 1 to 2n $C_1$-$C_4$ alkyl or halogen substituents or from 1 to n $C_1$-$C_4$ alkoxy substituents, where n is the number of carbon atoms in the monocycloalkane ring;

siloxanes of the formula $(R_3Si)(OSiR_2)_p(OSiR_3)$ and cyclosiloxanes of the formula $(SiR'_2O)_q$, where p is from 0 to 4, q is from 2 to 6 (preferably from 3 to 5), each R and R' is independently H, $C_1$-$C_6$ alkyl, benzyl or phenyl substituted with from 0 to 3 $C_1$-$C_4$ alkyl groups (preferably R' is methyl); and $C_3$-$C_8$ fluoroalkanes substituted with from 1 to (2m+2) fluorine atoms and that are liquid at ambient temperatures, where m is the number of carbon atoms in the fluoroalkane. In a preferred embodiment, the solvent comprises a $C_5$-$C_{10}$ cycloalkane (e.g., cyclohexane, cycloheptane, cyclooctane, cis-decalin, etc.). In another embodiment, the solvent comprises one or more $C_5$-$C_{10}$ mono- and/or bicycloalkanes, which may be substituted by up to 3 $C_1$-$C_4$ alkyl groups. However, other apolar and/or non-polar solvents (e.g., saturated hydrocarbons such as $C_5$-$C_{12}$ alkanes, aliphatic ethers such as di-$C_2$-$C_6$ alkyl ethers, methyl $C_4$-$C_6$ alkyl ethers and di-$C_1$-$C_4$ alkyl $C_2$-$C_6$ alkylene diethers [e.g., glyme], cyclic ethers such as tetrahydrofuran and dioxane, arenes such as benzene, toluene and xylenes, etc.) may be included in the present composition.

The composition may further comprise one or more conventional additives, such as a surface tension reducing agent, a surfactant, a binding agent, a thickening agent, a photosensitizer, etc. Preferably, however, the composition is free from components that may introduce atoms or other species that may adversely affect the electrical properties of a thin film formed from the composition (e.g., carbon, nitrogen, alkali metals, etc.). When they are present, typical amounts of these components in the composition are from 0.01 wt. % to 10 wt. % (e.g., in trace amounts, or from 0.1 wt. % to 5 wt. %) of the composition. The surface tension reducing agent may be present in an amount of from 0.01 wt. % to 1 wt. %, preferably 0.02 wt. % to 0.1 wt. % of the ink composition. In certain embodiments, the surface tension reducing agent may comprise a conventional hydrocarbon surfactant, a conventional fluorocarbon surfactant or a mixture thereof. The wetting agent may be present in an amount of from 0.05 wt. % to 1 wt. %, preferably 0.1 wt. % to 0.5 wt. % of the ink composition. However, in an embodiment of the present ink including one or more relatively high molecular weight (poly)silanes (e.g., as described above), the relatively high molecular weight (poly)silane(s) may be effective to improve the wetting characteristics of the ink. The surfactant may be present in an amount of from 0.01 wt. % to 1 wt. %, preferably 0.05 wt. % to 0.5 wt. % of the ink composition. The binder and/or thickening agent may be present in an amount sufficient to provide the ink composition with predetermined flow properties at a given processing temperature.

However, such additives are not at all necessary. In fact, it is advantageous to exclude the additives from the ink, particularly where such additional components include sufficiently high molar proportions of elements such as carbon, oxygen, sulphur, nitrogen, or halogens to adversely affect electrical properties of the resulting thin film. As a result, the present composition may consist essentially of (1) the (poly)silane and/or nanoparticles and (2) the solvent. Alternatively, the present composition may consist essentially of the (poly)silane, without the addition of a solvent. However, use of a "solventless" (poly)silane in printing applications may involve adjustments to the printing and/or irradiation conditions, such as irradiation power, timing, etc.

In one embodiment, the Group IVA precursor ink composition consists essentially of components in the liquid phase at ambient temperatures. Use of all liquid phase components may avoid a number of problems associated with use of solid-phase components, such as non-uniformities in the distribution of the components in the composition (e.g., the composition is in the form of a colloid or suspension) and/or in the thin film formed on the substrate (e.g., the solid-phase component[s] tend to move along the substrate surface at a lower rate than the liquid-phase components in the composition).

(Poly)silane compounds are generally temperature and light sensitive. Thus, the ink compositions as described above, once prepared, are stored at low temperatures (e.g., below 0° C., or less than or equal to −40° C.), and with light and UV protection (e.g., storing in a darkened vial or wrapping with aluminum foil) to avoid any unwanted isomerization or generation of higher molecular weight components.

The present invention also relates to a method of making a composition including one or more Group IVA compounds (e.g., an ink containing one or more (poly)silanes and/or nanoparticles). The method comprises combining the (poly)silane(s) and/or nanoparticles with a solvent, and mixing the (poly)silane(s) and/or nanoparticles and the solvent sufficiently to dissolve the (poly)silane in the solvent and/or suspend the nanoparticles in the ink for a sufficient time to print the nanoparticle-containing ink. In the present embodiments, the composition comprises or consists essentially of from 1 to 40% by weight (e.g., from 5 to 30%, from 15 to 25% or any other range of values therein) of the (poly)silane(s) and/or nanoparticles.

The (poly)silane materials useful in the present invention tend to have low carbon content and excellent physical properties for making silicon thin films via coating (e.g., spin-coating) or printing (e.g., inkjet printing) processes. These materials are uniquely suited for making printed semiconductor devices (e.g., transistors, capacitors, diodes, etc.) and circuits including the same on various substrates, including but not limited to glass (e.g., quartz, amorphous silicon dioxide, etc.) sheets, wafers or slips, plastic and/or metal foils or slabs (e.g., polyimide or polyethylene sheets, or stainless steel or aluminum foils), silicon wafers, etc., all of which may carry one or more additional layers thereon (e.g., providing one or more dielectric, buffer, planarization and/or mechanical support functions, etc.). Applications for such films and devices (and products made therefrom on such substrates) include, but are not limited to displays (e.g., flat panel, plasma, LCD, organic or inorganic LED, electrophoretic, etc.), RF and/or RFID devices, EAS devices, so-called "smart" tags (high frequency devices such as toll booth tags), sensors, photovoltaics, and others.

Exemplary Methods for Printing a Semiconductor Ink

In another aspect, the present invention concerns a method of printing a patterned material, comprising the steps of: (a) printing an ink comprising a precursor of the material and a solvent in a pattern on a substrate, (b) precipitating the precursor (or a higher molecular weight or more insoluble derivative thereof) in the pattern to form a pinning line, (c) substantially evaporating the solvent to form the feature defined by the pinning line and/or pattern and comprising the precursor (or a higher molecular weight or more insoluble derivative thereof), and (d) converting the precursor (or a higher molecular weight or more insoluble derivative thereof) to the patterned material. Preferably, the patterned material comprises an electrically active material, such as a semiconductor (e.g., silicon and/or germanium), a metal (as described above), or a combination thereof (e.g., a metal alloy or a metal silicide). However, the present method of printing a patterned material is also applicable to printing an ink of a dielectric precursor material.

As discussed above, the precursor of an electronically functional material may comprise one or more (poly)silanes and/or one or more metal precursors, such as (organo)metallic compounds, (organo)metallic complexes, (organo)metallic clusters, metal nanoparticles, and combinations thereof. The method of printing the ink as disclosed herein preferably comprises inkjet printing a liquid composition comprising a Group IVA element precursor onto the substrate, wherein only predetermined portions of the substrate (generally corresponding to a pattern capable of being printed or inkjet printed) are covered with the composition. However, exemplary alternative printing techniques include gravure printing, offset lithography, flexographic printing, laser writing, microspotting, screen printing, etc. The present invention may also be suitable for non-selective (e.g., blanket) deposition techniques such as spin-coating, slide-bar coating, spin coating, extrusion coating, meniscus coating, dip coating, spray coating, etc. The printing and/or coating technique may be further adapted for subsequent and/or simultaneous irradiation (e.g., with UV light; see the discussion below).

The substrate may comprise a wafer, plate, disc, sheet and/or foil of a semiconductor (e.g. silicon), a glass, a ceramic, a dielectric, plastic and/or a metal, preferably a member selected from the group consisting of a silicon wafer, a glass plate, a ceramic plate or disc, a plastic sheet or disc, metal foil, a metal sheet or disc, and laminated or layered combinations thereof. For example, the substrate may further include one or more dielectric, buffer, planarization and/or mechanical support layers (such as a polyimide or other polymer, silicon and/or aluminum oxide, etc.) thereon, which may themselves be patterned and/or have patterned semiconductor, conductor and/or dielectric features thereon. Thus, the present ink may be printed directly on a portion of the coated substrate, or at least partially on one or more patterned features on the (coated) substrate. Such patterned features may have been formed by printing, photolithography, or other known patterning process. The present invention is particularly suited for printing (semi)conductor patterns on a thin sheet of plastic or metal foil coated with a dielectric material. The dielectric layer may have openings therein to facilitate electrical connections to the foil. In one example, the foil can serve as an antenna of a wireless device.

Figure 1A:
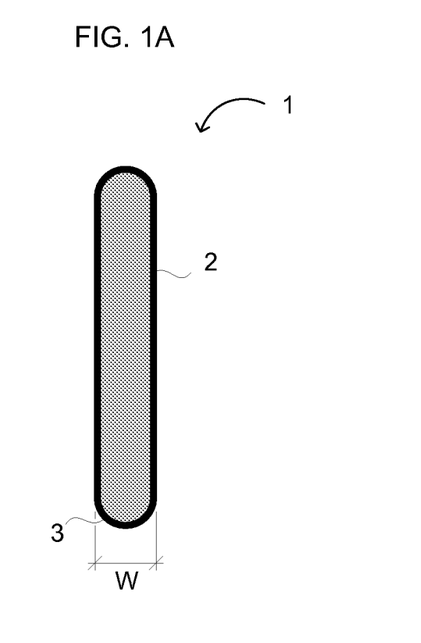
FIG. 1A shows a top-down view of an exemplary embodiment of a printed line/feature having a substantially rectangular shape and a dome-shaped profile.
Figure 1B:
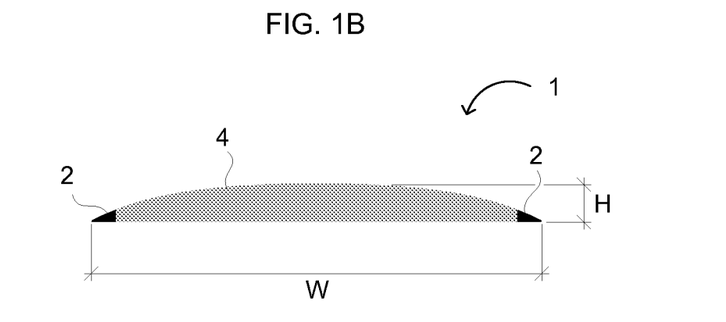
FIG. 1B shows a cross-sectional view of an exemplary embodiment of a printed line/feature having a dome-shaped cross-sectional profile.

In one embodiment, the present invention relates to printing an ink containing a liquid (poly)silane or metal precursor, as disclosed above, to form a feature with a predetermined cross-sectional profile (e.g., dome-shaped) and/or shape (e.g., an anisotropic shape, such as a line, rectangle, T shape, L shape, H shape, dumbbell shape or tab, or another shape such as a circle or square, any combination thereof, etc.). As shown in FIGS. 1A and 1B, a solute (e.g., a (poly)silane) in a printed ink may be precipitated to form a pinning line 2 at the corners of a printed feature (e.g., an island, line or other shape). Control of shape pinning may be improved by increasing the mass loading (i.e., the amount of (poly)silane in the solvent), particularly when the viscosity of the ink composition corresponds to mass loading of the material precursor, and/or by irradiating (e.g., with UV radiation) the ink during or shortly after printing (e.g., within 0.1 sec to 10 sec), which may result in polymerization or cross-linking of the solute, and therefore precipitation of further precursors of electrically active materials. Controlling other process conditions (e.g., the molecular weight of the ink precursor, the ink viscosity, the evaporation rate of the solvent, the substrate temperature, irradiation [e.g., UV] power, irradiation [e.g., UV] wavelength, etc.) may further control line pinning and may allow reproducibility of the dimensions (e.g., feature width and height) of a printed feature. A balance of these processes may result in acceptable pinning within a reasonable time after printing. Additionally, controlling the evaporation rate of the solvent influences the point at which the solute precipitates, and therefore may influence when the pinning line forms.

Preferable process conditions for inkjet printing a (poly)silane material may include a mass loading of 1-40 wt. % (preferably 20-30 wt. %) of the solute material, a viscosity of 2-15 cP, a printing frequency of about 1-100 kHz (preferably 5-50 kHz, 10-25 kHz, or any other range of values therein), and optionally UV irradiation with a UV power of 0.1-15 W/cm$^2$ (preferably 0.5-10 W/cm$^2$, 1-5 W/cm$^2$, or any other range of values therein), a dose in the range of 0.01 mJ/cm$^2$ to 1.2 J/cm$^2$, and a UV wavelength of 200-450 nm (preferably 250-380 nm, or any range of values therein). Preferable process conditions for inkjet printing a metal precursor material may include a mass loading of 1-40 wt. % (preferably 20-30 wt. %) of the solute, a printing frequency of about 1-100 kHz (preferably 5-50 kHz, 10-25 kHz, or any other range of values therein), and optionally UV irradiation with a UV power of 0.1-15 W/cm$^2$ (preferably 0.5-10 W/cm$^2$, 1-5 W/cm$^2$, or any other range of values therein), a dose in the range of 0.01 mJ/cm$^2$ to 1.2 J/cm$^2$, and a UV wavelength of 450-1000 nm (or any range of values therein). The substrate may be contemporaneously heated in accordance with a desired solvent evaporation rate (typically in a range of from 30° C.-90° C., depending on the solvent to be evaporated). In certain embodiments, the drop pitch or drop-to-drop spacing (which may be the same or different along each axis of a two-dimensional layout) may be about 1-500 µm (or any range of values therein), and the contact angle between the printed ink and the substrate may be from 0° to about 90° (or any range of values therein). A contact angle of 0° refers to a contact angle measured at 0°, but in reality, such a contact angle is slightly greater than 0°.

When printing a (poly)silane material, the printing step may be conducted under an inert and/or reducing atmosphere. Thus, the method may further comprise the steps of (i) purging an atmosphere in which the substrate is placed, then (ii) introducing an inert and/or reducing gas into the atmosphere, prior to the printing step. In various embodiments, the inert and/or reducing gas may comprise He, Ar, N$_2$, etc., which may further comprise H$_2$, NH$_3$, SiH$_4$, and/or other source of gas-phase reducing agent (e.g., in an amount up to about 20 vol. %). The inert and/or reducing gas atmosphere may reduce any incidence of inadvertent and/or undesired oxide formation. In a preferred embodiment, the composition may be printed under an inert atmosphere (preferably with O$_2$ levels <<1 ppm) to avoid unacceptably high oxygen content in the formed films, which may result in poor device performance. In one embodiment, the inert atmosphere consists essentially of Ar, and may further include less than 0.1 ppm O$_2$ and less than 100 ppm N$_2$.

One aspect of the invention involves irradiating a liquid-phase (poly)silane composition while depositing the composition on the substrate, or shortly thereafter (e.g., within 0.1 sec to 10 sec). In embodiments including (poly)silanes, this process may provide semiconductor features with dome-shaped profiles along at least one cross-sectional dimension. Without intending to be bound by any particular theory, it is believed that irradiating the composition during or immediately after printing causes the (poly)silane compound(s) therein to oligomerize, polymerize and/or crosslink, thereby reducing the volatility of the composition, increasing the viscosity of the composition and/or the average molecular weight of the (poly)silane compound(s) therein, and/or reducing the tendency of the printed ink to form a coffee-ring shaped cross-sectional profile during evaporation. If the substrate is covered with a liquid phase composition containing a precursor of a Group IVA element without irradiation during some part of the printing process, the ink composition may spread (e.g., migrate toward the edges or outline of the printed pattern of (poly)silane ink) and/or form printed features having a non-desired shape and/or cross-sectional profile.

The irradiation step may include irradiating the printed ink composition with light having a wavelength (or wavelength band) in the range of 200 nm to 450 nm, such as 220 nm to 400 nm, or 250 to 380 nm (or any other range of values therein) in the case of (poly)silane materials, or in the range of 250 nm to 1000 nm, such as 450 nm to 900 nm, or 480 to 780 nm (or any other range of values therein) in the case of metal precursor materials. Suitable sources for non-UV radiation include white light sources, Xe lamps, visible LEDs, UV LEDs coated with down-converting phosphors, IR lamps and lasers, visible lasers, etc., including sources of UV radiation having one or more UV filters positioned between the lamp output and the sample to be irradiated. A suitable source of UV radiation may comprise essentially any UV radiation source, such as a mercury vapor and/or mercury arc lamp, a UV LED, a UV laser, etc., or a white light source or other non-UV source having one or more visible and/or IR filters positioned between the lamp output and the sample to be irradiated, etc. The radiation dose may be in the range of 0.01 mJ/cm$^2$ to 1.2 J/cm$^2$, using a light source with a power output of about 0.1-15, 0.75-10 or 1-5 watt/cm$^2$ (or any other range of values therein), which may be transmitted directly or through a light guide or a slit, and/or which may be focused at the location of the substrate and/or the printed (poly)silane ink. To selectively irradiate only certain areas of the printed ink, the radiation from the lamp may be passed through a mask (e.g., a quartz plate having a chrome pattern thereon, which generally blocks UV radiation in areas where no exposure of printed (poly)silane ink is desired).

While any form of radiation (and more particularly, any wavelength of light) may be used, the irradiating step preferably comprises irradiating with ultraviolet light. Such irradiation generally yields a film of cross-linked, oligomeric and/or polymeric hydrogenated (poly)silanes, which can later be converted (e.g., by heating) into an amorphous hydrogenated semiconductor film (e.g., an amorphous, hydrogenated silicon film) suitable for electronic devices, and which optionally forms a microcrystalline and/or polycrystalline film upon further annealing, as described herein. Thus, the present invention may provide commercial quality semiconductor features (e.g., semiconductor lines) from a printed liquid (poly)silane composition.

The irradiating step is preferably conducted under an inert and/or reducing gas, as for the printing/depositing step, to reduce any incidence of inadvertent and/or undesired oxide formation. Similarly, the irradiating step may be conducted for a length of time sufficient to (i) cross-link, isomerize, oligomerize and/or polymerize the (poly)silane; (ii) form a substantially uniform layer on the substrate, the layer comprising an oligo- and/or polysilane; and/or (iii) increase an average molecular weight, increase a viscosity, and/or reduce a volatility of the composition.

Generally, the method includes evaporating the solvent to form a feature defined by the pinning line and/or pattern and comprising the precursor (or a higher molecular weight or more insoluble derivative thereof), and converting the precursor (or a higher molecular weight or more insoluble derivative thereof) to a patterned material. In one embodiment, evaporating the solvent may comprise heating the printed ink composition (and/or substrate) to a temperature of from about 30° C. to about 200° C. (e.g., from 30° C. to about 90° C., from 80° C. to about 120° C., or any other range of values therein) to further (i) remove any remaining solvent and/or (ii) oligomerize and/or polymerize the precursor material (e.g., [poly]silane), prior to converting the precursor to a patterned material (e.g., curing the composition). In one implementation, such heating (to remove solvent and/or to oligomerize and/or polymerize the precursor material) is conducted by placing the substrate on a hot plate under an inert atmosphere, although one could also use a conventional oven or furnace (or an IR heating lamp in an enclosable chamber) in which the atmosphere can be controlled for such heating. In a preferred embodiment, the solvent is evaporated under an inert atmosphere (preferably Ar, rather than N$_2$) with O$_2$ levels <<1 ppm to avoid unacceptably high oxygen content in the formed films, as explained above.

The method may further include a curing step to convert the dried, patterned precursor to a film of semiconductor, conductor or dielectric material. In the case of (poly)silanes, curing generally comprises heating the dried composition to a temperature of at least about 300° C. (preferably at least about 350° C., and more preferably at least about 400° C.) for a length of time sufficient to convert the composition to an amorphous, hydrogenated film comprising silicon and/or germanium. Such heating may be conducted for a length of time of at least 1 minute, 3 minutes or 5 minutes. While the maximum heating time may be about 1-4 hours in a typical embodiment, quality films can be obtained after heating at about 450° C. for 10-30 minutes.

In a typical implementation, the substrate having a (poly)silane film thereon (prepared as described above for the method of printing a precursor ink onto a substrate) is placed onto a hotplate and heated for about 5-20 minutes at a temperature of about 80° C. Thereafter, the substrate is placed into an oven for about 5-20 minutes at a temperature of about 350-450° C. under argon flow (<0.1 ppm O$_2$), a step sometimes referred to herein as "hard-curing." This procedure yields hydrogenated amorphous, microcrystalline and/or partially polycrystalline silicon features.

In a further embodiment, the method further comprises an annealing step, which may comprise heating the substrate and the printed, "soft-cured" and "hard-cured" features to a temperature and for a length of time sufficient to provide the film with certain predetermined or desired characteristics or qualities. For example, when the film being annealed comprises a hydrogenated, amorphous silicon and/or germanium film, heating to a temperature of from about 600° C. or more in a furnace, generally for a length of time of at least about 20 minutes, is sufficient to substantially dehydrogenate the amorphous silicon and/or germanium film. Conducting annealing at a higher temperature and/or for a greater length of time may (re)crystallize part or all of the film and/or activate at least some of the dopant (if present). Alternatively, annealing to form a microcrystalline or polycrystalline silicon and/or germanium film and/or to activate dopant may comprise conventional laser crystallization and/or UV flash lamp annealing.

In a preferred embodiment, the printing and the curing processes can be performed in the same, pure inert atmosphere (preferably Ar, rather than N$_2$) with O$_2$ levels <<1 ppm, as described herein. In one embodiment, the inert atmosphere consists essentially of Ar, and may further include less than 0.1 ppm O$_2$ and less than 100 ppm N$_2$.

The profile and dimensions of the structure formed from an ink printed on the substrate may be controlled and improved by adjusting the surface energy of the substrate to optimize the contact angle between the substrate and the printed ink. The total spread of the drop on the surface can be reduced by increasing a contact angle of the ink on the substrate. Desirable contact angles for printed inks may be relatively low (e.g., from 0° to 15°). Such contact angles can be used to fine tune the feature or line width (and, directly or indirectly, the feature or line height).

The surface energy of a substrate can be modified by printing a surface modifying agent or coating the substrate with such an agent to optimize the contact angle of printed liquids on a particular substrate (e.g., a Si wafer surface, a glass substrate, or a metal foil coated with $SiO_x$, a nitride, or a metal oxide surface layer, examples of which include silicon dioxide, $Al_yO_z$, TiN, etc) so that a desired pattern profile may be achieved. The particular coating used for substrate modification can be tailored to the surface being modified. For example, silazanes such as hexamethyldisilazane (HMDS), halosilanes such as trimethylsilyl chloride, and alkoxysilanes such as methyl triethoxysilane can react with and modify Si and/or silicon oxide surfaces.

For example, when an HMDS coating is evaporated onto a cleaned Si surface, one may obtain a contact angle of about 35-40° for a printed ink containing a (poly)silane in cis-decalin. In one embodiment, a wafer may be heated to 150° C. and cycled under $N_2$ and vacuum 3 times to remove any water adsorbed to the substrate surface. It can then be heated for 3 minutes at 150° C. under a pressure of 10-15 torr (e.g., 12.8 torr) of HMDS, and cooled to ambient temperature. The wafer is then considered to be coated with HMDS.

Contact angles between the substrate and the printed ink can be further lowered (to as low as 0°) by cleaning a Si surface with aqueous $H_2O_2$ for 10 min, or with a "piranha" clean (a concentrated aqueous $H_2SO_4/H_2O_2$ solution) for 10 min that may optionally be followed by an aqueous $H_2O_2$ clean for 10 min. In addition, medium contact angles (e.g., between 5° and 30°) can be created by taking an HMDS coated surface and reducing the coverage by controlled UV/ozone treatment for a predetermined time and at a predetermined UV power (e.g., 0.1-15 milliwatt/cm$^2$, for 10 seconds to 30 minutes), or controlled $O_2$/plasma treatment for a predetermined time and at a predetermined RF power (e.g., 1-5000 W, for 1 second to 60 minutes). Another method of partially or fully removing HMDS may include a high temperature bath (e.g., 30-90° C.) of $H_2O_2$ and $H_2SO_4$ (piranha) for a predetermined time (e.g., 1-60 minutes). These same methods or variations thereof may be adapted to other surface modifications and surfaces. For instance, the methods may be adapted to hydrophilic or hydrophobic surfaces.

High resolution patterning of the surface energy modified surface may be obtained by several methods. A patterned contact mask, when placed over an HMDS coated sample and over-exposed to UV/ozone, may result in a patterned surface, where the contact angle is high at unexposed locations and reduced (e.g., approaching 0°) at locations where the surface is exposed to UV radiation and ozone. Printing (poly)silane inks onto such areas may allow the drops of ink to take the shape of a low contact angle pattern. Methods to adjust, modify, change or pattern the surface energy as described herein are also applicable to other substrates and layers as described elsewhere herein.

Other methods of patterning the surface energy of a substrate may include using a high resolution laser (such as a UV, visible, or IR laser printing tool) to pattern the HMDS-coated surface after deposition. For surface modifications that are sensitive to a different wavelength of light, other laser wavelengths or bands such as IR or visible can be used to react with the chosen surface modifying agent, or to cleave the bond attaching it to the substrate. Another method may include depositing a liquid surfactant (such as HMDS) out of a poly (dimethylsiloxane) (PDMS) or other high resolution stamp or roller (e.g., using gravure printing).

Controlling the process conditions (e.g., the mass loading, the molecular weight of the ink precursor, the ink viscosity, the substrate temperature, UV power, UV wavelength, the time interval between printing and irradiation, the surface energy of the substrate, etc.) may allow more precise control and reproducibility of the dimensions (e.g., width, length and cross-sectional profile) of a semiconductor, metal or dielectric feature. The process conditions described above may sufficiently controlled to reproducibly form printed features (e.g., a metal, dielectric or semiconductor line, island, rectangle, T shape, L shape, H shape, dumbbell shape, tab, circle, square, combination thereof, etc.) having predetermined widths, lengths and cross-sectional profiles.

Exemplary Semiconductor Thin Films

A still further aspect of the invention relates to a semiconductor thin film feature or structure comprising a hydrogenated amorphous, microcrystalline or polycrystalline Group IVA element having a predetermined shape or outline and a dome-shaped profile along at least one axis. The method of forming a printed semiconductor feature, as described above, can be used to form a pattern on a substrate (e.g., lines, islands, rectangle, T shape, L shape, H shape, dumbbell shape, tab, circle, square, combination thereof, etc.) or a layer in a device (e.g., a capacitor, a diode, a resistor, or a TFT) comprising a semiconductor material including a Group IVA element(s). The semiconductor feature in accordance with the present invention generally comprises one or more Group IVA element(s) (e.g., Si and/or Ge), and less than about 0.1 at. % oxygen (preferably less than 0.05 at. % oxygen), less than about 100 ppm nitrogen (preferably less than 30 ppm nitrogen), and less than about 0.1 at. % carbon (preferably less than 0.05 at. % carbon). The patterned feature may have a width of about 1 to about 100 μm (e.g., 2 to 50 μm, 5 to 20 μm, or any other range of values therein). The patterned feature may have a (maximum) height of about 5 nm to about 10 μm (e.g., 25 nm to about 1 μm, 50 nm to about 100 nm, or any other range of values therein).

FIGS. 1A and 1B (which are not necessarily limited to semiconductor lines) show a printed line or island 1 that may be formed in accordance with the present disclosure. FIG. 1A shows a top-down view of printed line or island 1 having a width W and rounded corners or ends 3. FIG. 1B shows a cross-sectional view of printed line or island 1 having a dome-shaped profile 4 across the width of the printed line or island 1. Referring back to FIG. 1A, the cross-sectional profile along the length of printed line or island 1 may be substantially dome-shaped along at least part of its length (e.g., from the end 3 of the printed line or island 1 to a point along the length axis more than one drop diameter along the length axis, preferably in each half of the printed line or island 1 defined by the plane normal to the length axis at or about its midpoint). In one embodiment, the maximum height H of the printed line or island 1 is less than the width W of the printed line or island 1. The rounded corners 3 and dome-shaped profile 4 along or across at least one axis of the printed line or island 1 may allow for significant device and reliability advantages which cannot be achieved easily in conventional lithographically defined device features.

For example, printed active semiconductor features having rounded corners and a dome-shaped profile along at least one axis allow for uniform growth of thermal oxide over the entire feature (e.g., over a channel region in a silicon thin film transistor). Typically, due to stress effects at sharp corners, silicon oxide growth may be retarded and may result in significantly thinner dielectric at these locations. This may lead to enhanced electric field effects and leakage for certain operating voltages at these locations, which can result in premature breakdown and leakage. The dome-shaped profiles and rounded corners of printed semiconductor, conductor, and/or dielectric features of the present invention substantially avoid such issues, and may significantly improve the quality, lifetime, and/or yield of devices formed therefrom.

A printed gate electrode having a dome-shaped profile and rounded corners may also allow for controlled isotropic etching after printing, which may provide a simple and effective method of reducing critical dimensions (such as gate length) in printed transistors. In the case where two or more features (such as metal interconnect) have a crossover point (and which may have one or more additional films between the features at the crossover point), the underlying feature(s) can be printed and can have rounded corners and a dome-shaped profile in accordance with the invention, which may allow for smooth topological transitions without sharp steps, thereby preventing discontinuities in the overlying feature(s) and/or film(s) during its deposition and/or formation (e.g., by printing). As a result, more uniform step coverage of subsequently deposited or printed structures may be achieved. In the case of metal interconnect features, the thickness of an interlayer dielectric may be reduced because sharp corners (typical of conventional lithographically-defined metal features) may be substantially avoided, and thus the problem of conformal coverage over sharp corners may be substantially obviated.

Additionally, a gate electrode formed on or over a semiconductor feature printed in accordance with the present invention generally does not cross over a sharp transition region or step on (or over) a transistor channel in the printed semiconductor feature, which enables the use of electrode materials (such as molybdenum) which may otherwise be discontinuous as deposited. In a conventional process, using such materials may require a high temperature resist reflow, thereby increasing the dimension of the formed feature, and a sloped etch and/or use of alloying elements in or for the gate electrode. For logic devices, elimination of sharp corners and relatively thin gate oxides may reduce a source of variation, reduce leakage, and improve threshold voltage control (which may be adversely affected by non-uniformity of the gate oxide).

The cross-sectional profile of the printed structure may be further optimized by controlling the contact angle between the printed liquid and the substrate. This is an important factor that works in concert with the ink mass loading; the average MW of the ink solute (e.g., a (poly)silane or metal precursor), which influences ink viscosity and precipitation; the irradiation dose; and the frequency of the printing operations (e.g., the time between the release of a drop from the print head [or the contact of the drop with the substrate] and optionally irradiating the drop/island on the substrate). Spread of the ink drop from the printed area of the substrate can be reduced by increasing the contact angle of the drop on the substrate. The contact angle may be controlled by adjusting the surface energy of the substrate. In the case of a Group IVA element precursor ink, making the substrate surface more hydrophobic (e.g., coating the substrate with a hydrophobic compound) may increase the contact angle. Substrate contact angles for printed Group IVA element precursor inks on oxide-coated substrates such as silicon wafers and metal foils are, in some cases, from 0-15 degrees (e.g., preferably from greater than 0° to 5°), and such contact angles can be adjusted to fine tune the feature width (and, directly or indirectly, the height or maximum height of the feature).

A printed feature having rounded corners and a dome-shaped profile may also allow for uniform silicidation (or contact formation) across the entire surface of the dome. For a given dome area (e.g., footprint or outline of the feature on the device), the contact area may be larger than a lithographically defined feature of the same footprint or outline, thereby enabling a possible reduction in the ohmic resistance of the dome-shaped structure containing the metal silicide on its surface relative to an otherwise comparable photolithographically-defined feature.

Figure 2:
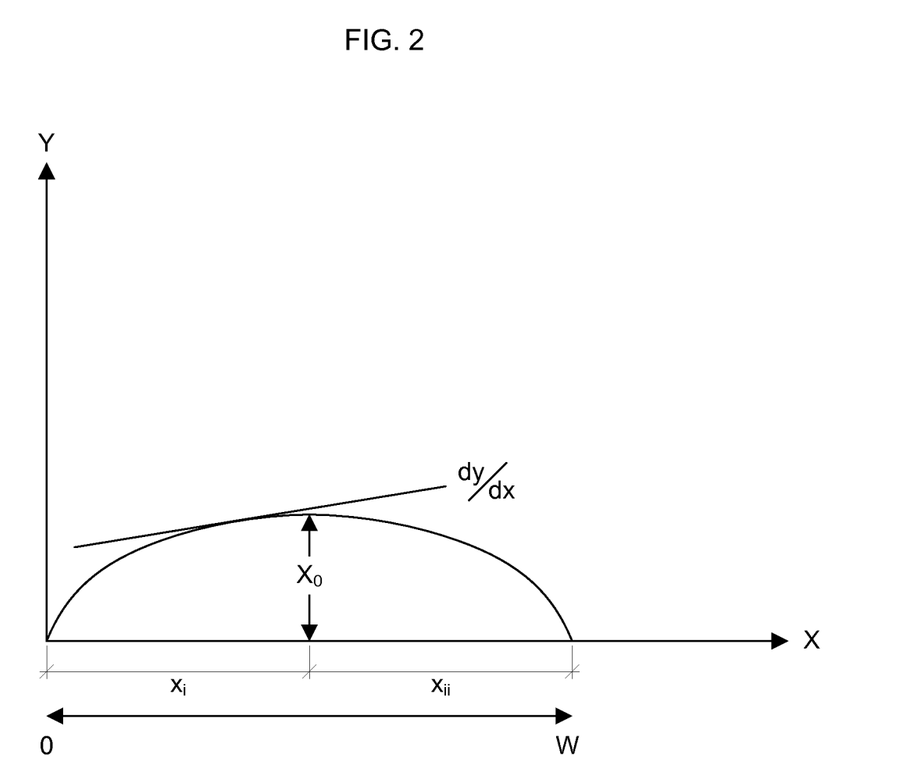
FIG. 2 shows a graphical representation of a printed semiconductor line/feature having a dome-shaped cross-sectional profile.

Printing liquid ink compositions in accordance with the presently disclosed methods may provide printed features with anisotropic shapes (e.g., having differing width, length and height values, or having at least two different predetermined values for at least one of the width and/or length dimensions of the feature, along the entirety of the other dimension), and optionally, a dome-shaped cross-sectional profile that varies smoothly in at least one dimension, as seen in the cross-sectional view of FIG. 2 (see, e.g., U.S. Provisional Patent App. No. 60/927,984, filed May 4, 2007 and U.S. patent application Ser. No. 11/842,884, filed Aug. 21, 2007, the relevant portions of which are incorporated herein by reference). Anisotropic shapes that are printable using the present invention include lines, rectangles, T shapes, L shapes, H shapes, dumbbell shapes, tabs (e.g., orthogonal or angled extensions from a main or primary shape), and combinations thereof, as long as they have rounded corners and (optionally) a dome-shaped profile along at least one axis of the printed feature. Naturally, the present invention is also applicable to isotropic shapes, such as circles and squares.

In one embodiment (e.g., as shown in FIG. 1B), the cross-sectional profile of ideal structures obtained by printing may be mathematically defined by the value of the tangent at points along the upper surface of the cross-section as a function of the horizontal (X) dimension (see FIG. 2). FIG. 2 defines the intended cross-sectional profile of a printed feature having a cross-sectional width of W. $X_0$ represents the horizontal point at the maximum height of the feature ($X_0$ may optionally be the horizontal midpoint of the dome-shaped profile). The variable $x_i$ represents horizontal values that are less than $X_0$ (i.e., $0 \leq x_i \leq X_0$). The variable $x_{ii}$ represents horizontal values that are greater than $X_0$ (i.e., $X_0 < x_{ii} \leq W$). The tangent at any value of $x_i$ is given by $dy/dx_i$, and the tangent at $X_0$ is given by $dy/dX_0$. The dome-shaped profile of FIG. 2 can be defined for any value of $x_i$ by $dy/dx_i > dy/dX_0$, wherein $dy/dx_i$ continually decreases at each successive, increasing value of $x_i$. The tangent at any value of $x_{ii}$ is given by $dy/dx_{ii}$. The dome-shaped profile of FIG. 2 can also be defined for any value of $x_{ii}$ by $dy/dx_{ii} < dy/dX_0$, wherein $dy/dx_{ii}$ continually decreases at each successive, increasing value of $x_{ii}$. The dome-shaped profile as defined in this paragraph and FIG. 2 provides the advantages of a printed semiconductor, metal or dielectric feature having a dome-shaped cross-sectional profile as discussed herein. However, it should be understood that this mathematical description provides an ideal profile, and, in practice, there may be small imperfections or irregularities in the surface and/or profile of a feature printed in accordance with the presently disclosed methods.

Figure 3:
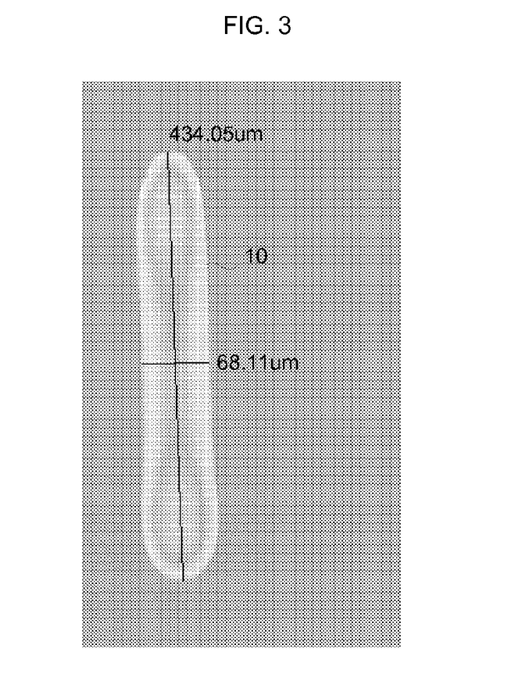
FIG. 3 shows a top-down optical image of a printed semiconductor line having a dome-shaped cross-sectional profile along its width, formed in accordance with the present invention.

FIGS. 3-6 show images and profilometer data collected from actual printed semiconductor features in accordance with the present invention. FIG. 3 shows an optical image of a printed line 10 formed from an ink containing 20 wt. % of a polysilane prepared by catalytic dehydrogenative coupling of cyclopentasilane (see, e.g., U.S. patent application Ser. No. 11/867,587, filed Oct. 4, 2007, the relevant portions of which are incorporated herein by reference) in distilled cis-decalin, printed on a Si wafer with 1.1 μm thermal oxide grown thereon, using a Dimatix DMP (Dimatix Materials Printer) inkjet printer with 8 pL DPN (drive per nozzle) inkjet heads and a 1 mL cartridge. Printing conditions included a platen temperature of 50° C., a fly height of 500 μm, a 5 kHz drop printing frequency, a 5 m/s drop velocity, a contact angle of about 0°, a 30 μm pitch, and application of 250-450 nm wavelength radiation in a radiation dose of 1 mJ/cm², at a 5 W/cm² UV power. Printed line 10 has an average width of about 70 μm and a maximum length of about 435 μm. As shown in FIG. 3, the printed feature has substantially rounded corners.

Figure 4:
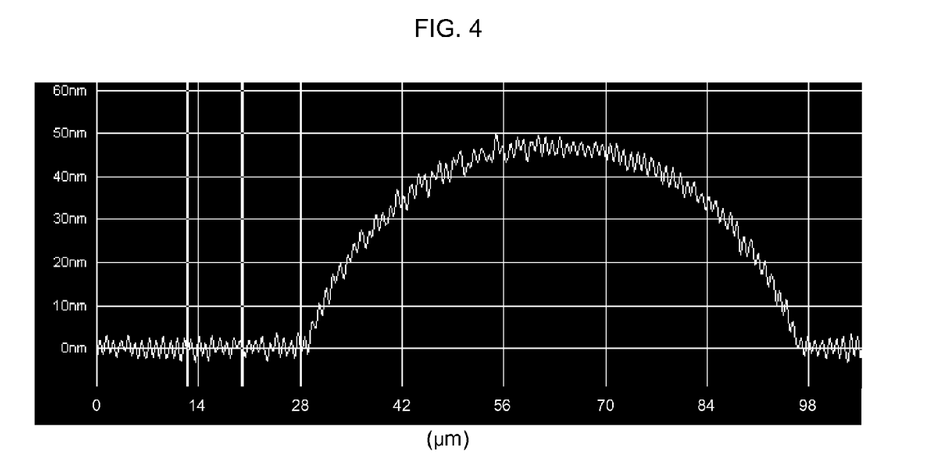
FIG. 4 shows a profilometer scan of a cross-section of the printed semiconductor line of FIG. 3.

FIG. 4 is a graph plotting the cross section from a profilometer scan of the profile of the printed line 10 of FIG. 3. The y-axis gives the height in nm of the profile of printed line 10, wherein the surface of the substrate on which line 10 is printed is at 0 nm. The data shows that the printed line has a substantially smooth, dome-shaped profile having a maximum height of about 45-50 nm. (The high frequency noise in the scan is from environmental vibrations during the measurement). Such a feature may have particular use as a channel layer or gate of a thin film transistor.

Figure 5:
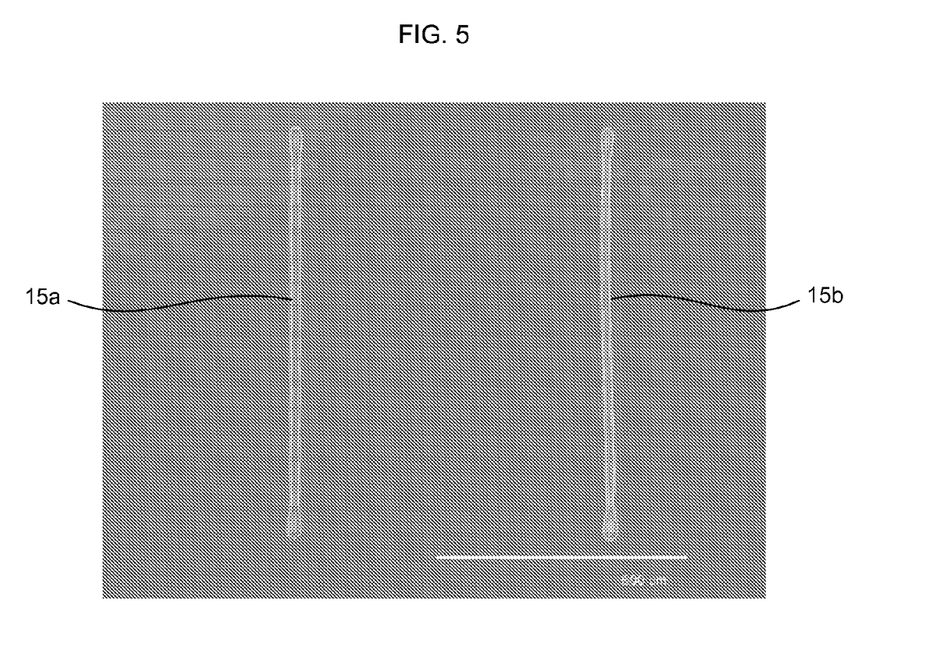
FIG. 5 shows a top-down optical image of a second printed semiconductor line having a dome-shaped cross-sectional profile along its width, formed in accordance with the present invention.

FIG. 5 shows an optical image of printed lines 15a-15b formed from an ink containing (i) 20 wt. % of a polysilane prepared by catalytic dehydrogenative coupling of cyclopentasilane and (ii) 5 wt. % cyclopentasilane in distilled cis-decalin, printed on a Si wafer with 1.1 μm thermal oxide grown thereon, using a Dimatix DMP (Dimatix Materials Printer) inkjet printer with 1 pL DPN (drive per nozzle) inkjet heads and a 1 mL cartridge. Printing conditions included a platen temperature of 50° C., a fly height of 500 μm, a 3 kHz drop printing frequency, a 10 m/s drop velocity, a contact angle of about 0°, a 25 μm minimum pitch, and application of 250-450 nm wavelength radiation at a 0 W/cm² UV power. Printed line 15 has an average width of about 20 μm and a maximum length>500 μm. As shown in FIG. 5, the printed feature has substantially rounded corners.

Figure 6:
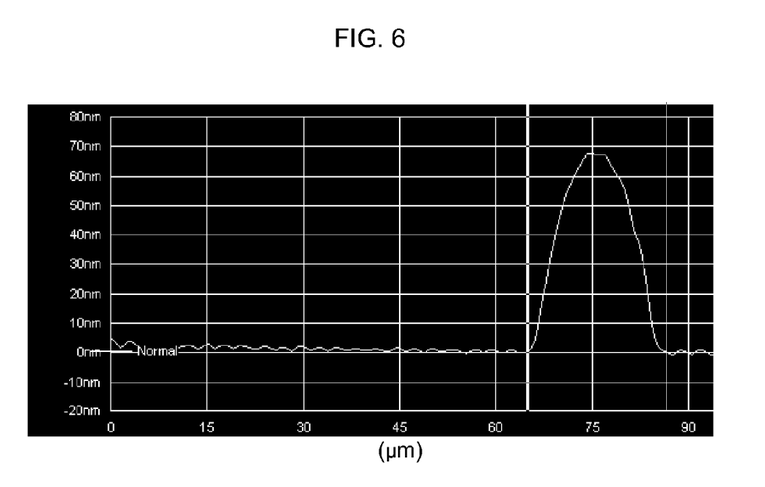
FIG. 6 shows a profilometer scan of a cross-section of a printed semiconductor line of FIG. 5.

FIG. 6 is a graph plotting two-dimensional data from a profilometer scan of the profile of one of the printed lines 15a-15b of FIG. 5. The y-axis gives the height in nm of the profile of the printed line, wherein the surface of the substrate on which the line is printed is at 0 nm, and the x-axis gives a horizontal measurement of the profile scan in μm. The data of FIG. 6 shows that this narrower printed line also has a substantially smooth, dome-shaped profile having a maximum height of about 65 nm. Other lines printed using the same ink and the same printing conditions gave similar, reproducible results.

In certain embodiments, the pattern of electrically functional material may comprise an array of lines or other features having a width of from 100 nm to 100 μm, preferably from 0.5 μm to 50 μm, and more preferably from 1 μm to 20 μm. The lines may have an inter-feature (e.g., inter-line) spacing (or pitch) of from 100 nm to 100 μm, preferably 200 nm to 50 μm, more preferably 500 nm to 10 μm. Furthermore, at least a subset of the features may have a length of from 1 μm to 5000 μm, preferably 2 μm to 2000 μm, more preferably 5 μm to 1000 μm, and a thickness (or maximum height) of from 0.001 μm to 1000 μm, preferably 0.01 μm to 500 μm, more preferably 0.05 μm to 250 μm. Furthermore, the features may comprise a first set of substantially collinear features (e.g., parallel lines) along a first axis, and a second set of substantially collinear features (e.g., parallel lines) along a second axis perpendicular to the first axis. Although parallel and perpendicular features may minimize adverse effects from adjacent features (e.g., lines) and/or maximize the predictability of electromagnetic field effects from adjacent features, the patterned features may take any shape and/or take any course that can be designed and formed (e.g., by printing).

In a preferred embodiment, the printed semiconductor thin film feature comprises a hydrogenated amorphous, microcrystalline or at least partially polycrystalline film of a Group IVA element, the Group IVA element comprising or consisting essentially of at least one of silicon and germanium, and which may be doped or undoped. In certain embodiments, the Group IVA element in the thin film structure comprises or consists essentially of silicon, and a dopant (which may be B, P, As or Sb, but which is preferably B or P) may have a concentration of from about $10^{16}$ to about $10^{21}$ atoms/cm³. The concentration profile of the dopant in the thin film may not vary significantly throughout the substantial thickness or depth of the film, including in the amorphous state.

The printed semiconductor pattern may have a maximum height of from 0.005 μm to 1000 μm (e.g., from 0.01 μm to 10 μm, 0.025 μm to 1 μm, or any other range of values therein). The printed features prepared by the present method(s) and/or from the present composition(s) may show greater profile uniformity relative to films made by processes in which irradiation does not immediately follow printing of the Group IVA precursor ink (e.g., when there is no irradiation or there is a delay of more than about 10 sec), and/or from an otherwise identical composition having a lower viscosity, a lower molecular weight solute, and/or a smaller mass loading of the solute.

Similarly, the metal pattern may have a maximum height of from 0.01 μm to 1000 μm (e.g., from 0.025 μm to 10 μm, 0.05 μm to 2 μm, or any other range of values therein). The films prepared by the present method(s) and/or from the present composition(s) may show greater thickness and profile uniformity relative to films made by other processes and/or from other metal precursor inks having a lower viscosity, a lower molecular weight solute, and/or a smaller mass loading of the solute.

Exemplary Thin Film Devices

The present invention also concerns a device such as a thin film capacitor, diode (e.g., a Schottky diode, Zener diode, photodiode, etc.), resistor or thin film transistor, comprising the present printed, dome-shaped semiconductor thin film feature, a device terminal layer above or below the printed semiconductor thin film feature, and one or more metallization structures in contact with the printed semiconductor thin film feature and/or the device terminal layer. In one embodiment, the thin film transistor comprises a bottom-gate transistor that includes a transistor gate layer which may comprise a first printed, dome-shaped semiconductor thin film feature, a thin dielectric layer thereon, and a second printed, dome-shaped semiconductor thin film feature (optionally doped) thereon. In such an embodiment, the second printed semiconductor thin film feature contains the transistor source, channel and drain. Alternatively, the substrate may contain the transistor gate and the (first) printed dome-shaped semiconductor thin film feature contains the transistor source, channel and drain.

In another embodiment, the transistor gate layer may be above the transistor source, channel and drain (a so-called "top gate" transistor). In either case, the source/drain terminal layer comprises a printed, dome-shaped, doped semiconductor thin film feature. However, in the "top gate" case, the transistor gate layer may comprise a conventional semiconductor material, a conventional conducting material, or a laminate of two or more conventional semiconductor and/or conducting materials (e.g., heavily doped silicon with a transition metal silicide, such as nickel silicide, titanium silicide, cobalt silicide, molybdenum silicide or tungsten silicide, thereon). The transistor may further comprise a contact structure and/or one or more metallization structures in physical and/or electrical contact with the source and drain structures of the source/drain terminal layer (and optionally, in physical and/or electrical contact with the gate layer).

In another embodiment, a thin film capacitor, such as a MOS capacitor, comprises a lower metal layer, such as Al, under an oxide layer, such as $Al_2O_3$, on which a semiconductor layer (e.g., doped or undoped amorphous Si or polysilicon) may be formed (e.g., in accordance with the present invention). Generally, an upper metal layer (e.g., of Al, an Al alloy, Ni or Ag) is then formed on the doped semiconductor layer. In another embodiment, the semiconductor layer comprises (i) a lower undoped or lightly doped amorphous silicon or polysilicon layer and (ii) an upper heavily doped amorphous silicon or polysilicon layer. Generally the upper, more heavily doped silicon layer is thinner than the bottom, less doped or undoped, silicon layer. Alternatively, the capacitor layers may be reversed (e.g., upper metal on oxide on doped silicon on lower metal). Zener diodes may be made by a similar process, in which a plurality of (doped) semiconductor layers having different dopant types (e.g., p, n or i) and/or concentration levels may be formed sequentially, one on another, as is known in the art. Schottky diodes may also be made by a similar process, in which one or more (doped) semiconductor layers (formed in accordance with the present invention) and a metal layer are formed in contact with one another (e.g., in a stacked or laminate-type structure) so to form a metal-semiconductor junction, as is known in the art. Any or all of the metal and/or semiconductor layers in such capacitors and diodes can be formed (e.g., printed) in accordance with the present invention. Photodiodes comprising the present printed, dome-shaped, doped semiconductor film may also be formed in accordance with the description(s) herein and with techniques known in the art, such that a photoconductive or photosensitive material (e.g., the present doped semiconductor film) may be configured to receive light and provide variable (but predictable and/or predetermined) electrical properties and/or functions in response to such light. Examples of such diode structures and how to make and use the same are disclosed in U.S. patent application Ser. No. 11/243,460, filed on Oct. 3, 2005, and U.S. Pat. No. 7,152,804, the relevant portions of both of which are incorporated herein by reference.

Exemplary Methods of Making Thin Film Devices

The present invention further relates to a method of making a device such as a capacitor, diode, resistor and/or transistor, comprising (i) printing a (doped or undoped) Group IVA precursor ink on a substrate in accordance with the methods disclosed herein, (ii) irradiating and curing the printed ink to form a semiconductor thin film as discussed above, and (iii) forming a metallization structure in electrical communication with the film. The metallization structure may be formed by conventional metal deposition (e.g., by conventional sputtering or evaporation) and photolithography, by printing and/or other deposition techniques using metallic inks as discussed herein, by conventionally dispensing commercial metal pastes, by conventional electro- or electroless plating, or alternatively, by laser patterning techniques to yield metal source/drain (and optionally, gate) contacts. The method may further comprise conventionally growing or depositing an oxide and/or nitride (e.g., silicon oxide, silicon nitride) on the printed semiconductor thin film or on the substrate (e.g., a conventional single-crystal silicon wafer). An exemplary thin film transistor (TFT) may be made using one or more process steps as described in U.S. patent application Ser. Nos. 11/452,108, 11/818,078, 11/888,949, 11/888,942 and 11/842,884, filed Jun. 12, 2006, Jun. 12, 2007, Aug. 3, 2007, Aug. 3, 2007 and Aug. 21, 2007, respectively, the relevant portions of each of which are incorporated herein by reference, but using the ink composition and printing method described herein for at least one step (e.g., printing the doped or undoped Group IVA precursor ink on the substrate).

CONCLUSION/SUMMARY

Embodiments of the present invention relate to printing (e.g., inkjet printing) electrically functional (e.g., silicon and/or metal) and/or dielectric features. The embodiments provide improved printing process conditions that allow for more precise control of critical dimensions of an electrically active feature, such as a semiconductor or metal line, or a dielectric feature such as a "print-on" dopant or a patterned passivation layer. For example, a semiconductor, metal or dielectric ink printed in a predetermined shape or outline (e.g., a line, rectangle, T shape, L shape, H shape, dumbbell shape, tab, circle, square, combination thereof, etc.) may be provided by improved control of the pinning process. To improve control over pinning, the printed precursor ink may be irradiated with radiation during or shortly after printing. This invention may be particularly useful for printing both channels (islands) and gates of thin film transistors, using (for example) polysilane-, polygermane-, and/or polygermasilane-containing inks.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A composition, comprising:
   a) one or more semiconductor precursors selected from the group consisting of (poly)silanes, (poly)germanes, and (poly)germasilanes in an amount of from 1 to 40% by weight, wherein at least 75 mmol % of said (poly)silanes, (poly)germanes, and (poly)germasilanes consist essentially of species having (i) from 15 to about 1,000,000 silicon and/or germanium atoms and (ii) hydrogen, and said (poly)silanes, (poly)germanes, and (poly)germasilanes are prepared by catalytic polymerization and subsequent removal of catalyst from said (poly)silanes, (poly)germanes, and (poly)germasilanes; and
   b) a solvent in which the one or more semiconductor precursors is soluble, wherein the composition has a viscosity of from 2 to 100 cP.

2. The composition of claim 1, wherein said viscosity is from 2 to 15 cP.

3. The composition of claim 1, consisting essentially of said (poly)silane(s) and said solvent.

4. The composition of claim 1, wherein said solvent comprises a $C_5$-$C_{12}$ linear or branched alkane, a $C_5$-$C_{10}$ mono- or bicycloalkane, or a $C_5$-$C_{10}$ mono- or bicycloalkane substituted by up to 3 $C_1$-$C_4$ alkyl groups.

5. The composition of claim 1, wherein the (poly)silanes, (poly)germanes, (poly)germasilanes, and solvent are in a liquid phase at ambient temperatures.

6. A method of forming a patterned material on a substrate, comprising:
   a) printing an ink comprising a precursor of said patterned material and a solvent in a pattern on the substrate, in which the ink has a viscosity of from 2 to 100 cP, wherein the precursor is selected from the group consisting of (poly)silanes, (poly)germanes, and (poly)germasilanes;

b) irradiating the ink during or immediately after printing;

c) substantially evaporating the solvent to form the feature comprising the precursor or a higher molecular weight or more insoluble derivative thereof; and d) converting said precursor or higher molecular weight or more insoluble derivative thereof to said patterned material.

7. The method of claim 6, wherein said ink has a mass loading of 1-40% of said precursor.

8. The method of claim 6, wherein said patterned material comprises a plurality of features having a dome-shaped cross-sectional profile.

9. The method of claim 6, wherein at least 75 mol % of said precursor consists essentially of species having at least 15 silicon and/or germanium atoms and hydrogen.

10. The method of claim 6, wherein said solvent comprises a $C_5$-$C_{10}$ alkane or a $C_5$-$C_{10}$ mono- or bicycloalkane, either of which may be substituted by up to 3 $C_1$-$C_4$ alkyl groups.

11. The method of claim 6, wherein irradiating said ink comprises irradiating said ink with UV radiation.

12. The method of claim 6, wherein irradiating said ink is performed within about 0.1 to about 10 seconds of printing.

13. The method of claim 11, wherein irradiating said ink comprises irradiating with UV power in a range of 0.5-10 W/cm$^2$ and a wavelength in a range of from 200 to 450 nm.

14. The method of claim 6, wherein irradiating the ink and evaporating the solvent occur concurrently.

15. The method of claim 6, wherein evaporating the solvent comprises heating the substrate to a temperature in a range of from 30° C.-90° C.

16. The method of claim 6, further comprising depositing a surface energy modifying agent on said substrate prior to printing the ink.

17. The method of claim 16, wherein said surface energy modifying agent renders an exposed surface of said substrate hydrophobic.

18. The method of claim 16, wherein said surface energy modifying agent renders an exposed surface of said substrate hydrophilic.

19. The method of claim 16, wherein a contact angle of the printed ink is from 0° to 15°.

20. The method of claim 6, wherein the pattern in the print direction has a drop pitch of 1-100 μm.

21. The method of claim 6, wherein printing is performed in an inert atmosphere.

22. The method of claim 6, wherein converting said precursor (or a higher molecular weight or more insoluble derivative thereof) to said patterned material comprises curing in an inert atmosphere.

23. The method of claim 22, wherein curing comprises a hard curing phase and a dehydrogenation curing phase.

24. A pattern on a substrate, the pattern having one or more solid features consisting essentially of one or more Group IVA elements selected from the group consisting of silicon and germanium, and at least one solid feature has a dome-shaped cross-sectional profile along at least one axis.

25. The pattern of claim 24, wherein the pattern comprises amorphous silicon.

26. The pattern of claim 24, wherein the pattern comprises polycrystalline silicon.

27. The pattern of claim 24, wherein the pattern includes germanium.

28. The pattern of claim 24, wherein the pattern has rounded corners in a top-down view.

29. The pattern of claim 24, wherein the one or more Group IVA elements has less than 0.05 atom % oxygen.

30. The pattern of claim 24, wherein the one or more Group IVA elements has less than 10 ppm nitrogen.

31. The pattern of claim 24, wherein the one or more Group IVA elements has less than 0.05 atom % carbon.

32. The pattern of claim 24, wherein each of said one or more features has a width of from about 1 micron to about 100 microns.

33. The pattern of claim 24, wherein each of said one or more features has a maximum height of from about 5 nanometers to about 10 microns.

34. The pattern of claim 24, wherein the pattern consists essentially of a hydrogenated Group IVA element.

35. The pattern of claim 24, wherein the substrate comprises a glass sheet, wafer or slip, a semiconductor wafer or a plastic and/or metal foil, slab or sheet, any of which may further include one or more additional dielectric, buffer, planarization and/or mechanical support layers thereon.

36. The method of claim 22, wherein curing comprises a hard curing phase.

37. The method of claim 36, wherein said hard curing phase comprises heating said precursor for about 5 to 20 minutes at a temperature of from 350 to 450° C.

38. The composition of claim 1, wherein the removal of catalyst from said (poly)silanes, (poly)germanes, and (poly)germasilanes comprises washing said (poly)silanes, (poly)germanes, and (poly)germasilanes with a fluid comprising an immiscible polar solvent.

39. The composition of claim 1, wherein the removal of catalyst from said (poly)silanes, (poly)germanes, and (poly)germasilanes comprises washing said (poly)silanes, (poly)germanes, and (poly)germasilanes with a fluid comprising water.

* * * * *

UNITED STATES PATENT AND TRADEMARK OFFICE
CERTIFICATE OF CORRECTION

| | | |
|---|---|---|
| PATENT NO. | : 8,530,589 B2 | Page 1 of 1 |
| APPLICATION NO. | : 12/114741 | |
| DATED | : September 10, 2013 | |
| INVENTOR(S) | : Scher et al. | |

It is certified that error appears in the above-identified patent and that said Letters Patent is hereby corrected as shown below:

In the Claims

Claim 1, column 24, line 42, that portion of Claim 1 reading "75 mmol %" should read --75 mol %--.

Signed and Sealed this
Seventeenth Day of June, 2014

Michelle K. Lee
*Deputy Director of the United States Patent and Trademark Office*